United States Patent
Hosogaya et al.

(10) Patent No.: US 8,885,406 B2
(45) Date of Patent: Nov. 11, 2014

(54) MEMORY DEVICE, MEMORY CONTROL DEVICE, AND MEMORY CONTROL METHOD

(71) Applicant: Sony Corporation, Tokyo (JP)

(72) Inventors: Yuto Hosogaya, Tokyo (JP); Shingo Aso, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/866,636

(22) Filed: Apr. 19, 2013

(65) Prior Publication Data

US 2013/0286731 A1    Oct. 31, 2013

(30) Foreign Application Priority Data

Apr. 27, 2012   (JP) .................. 2012-102135

(51) Int. Cl.
| | | |
|---|---|---|
| *G11C 11/34* | (2006.01) | |
| *G11C 16/04* | (2006.01) | |
| *G11C 29/00* | (2006.01) | |
| *G11C 11/56* | (2006.01) | |
| *G11C 16/10* | (2006.01) | |

(52) U.S. Cl.
CPC ............ *G11C 16/10* (2013.01); *G11C 16/0483* (2013.01); *G11C 29/74* (2013.01); *G11C 11/5628* (2013.01); *G11C 2211/5641* (2013.01)
USPC ............ 365/185.03; 365/185.05; 365/185.11; 365/185.17; 365/185.19; 365/185.23; 365/185.24; 365/189.011; 365/189.16

(58) Field of Classification Search
CPC ................. G11C 2211/5648; G11C 16/0483; G11C 2211/5621; G11C 2211/5642; G11C 2211/5641
USPC ............ 365/185.03, 185.05, 185.11, 185.17, 365/185.19, 185.23, 185.24, 189.011, 365/189.16
See application file for complete search history.

(56) References Cited

U.S. PATENT DOCUMENTS

| | | | |
|---|---|---|---|
| 2010/0195385 A1* | 8/2010 | Lim ......................... | 365/185.03 |
| 2011/0044104 A1* | 2/2011 | Kang et al. ............... | 365/185.03 |
| 2011/0153919 A1* | 6/2011 | Sabbag ...................... | 711/103 |
| 2011/0292725 A1* | 12/2011 | Choi et al. ............... | 365/185.03 |

FOREIGN PATENT DOCUMENTS

| | | |
|---|---|---|
| JP | 2008-198265 | 8/2008 |
| JP | 2010-198407 | 9/2010 |

* cited by examiner

*Primary Examiner* — Fernando Hidalgo
(74) *Attorney, Agent, or Firm* — K&L Gates LLP

(57) ABSTRACT

A memory device includes: a plurality of nonvolatile memory sections configured to allow one memory cell to record data of a plurality of bits, and to include a corresponding number of pages to the plurality of bits in accordance with a plurality of the memory cells as a write control unit; and a control section configured to control writing and reading data to and from the plurality of nonvolatile memory sections, wherein among the plurality of nonvolatile memory sections, if data is written into one of the nonvolatile memory sections, the data is written for each page in sequence from a low-order page to a high-order page, and when the data is written into the low-order page, control is performed such that the data to be written into the low-order page is written into any area of the other of the nonvolatile memory sections at same timing.

7 Claims, 7 Drawing Sheets

FIG. 5A
| LOW-ORDER PAGE | HIGH-ORDER PAGE |
|---|---|
| PAGE0 | PAGE1 |
| PAGE2 | PAGE3 |
| PAGE4 | PAGE5 |
| PAGE6 | PAGE7 |
| PAGE8 | PAGE9 |
| PAGE10 | PAGE11 |
| PAGE12 | PAGE13 |
| PAGE14 | PAGE15 |
FIG. 5B
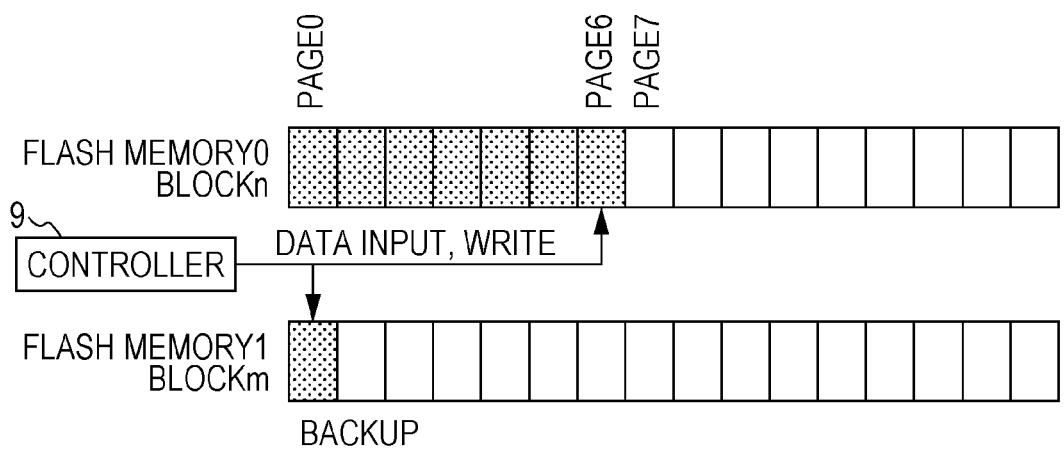
FIG. 5C
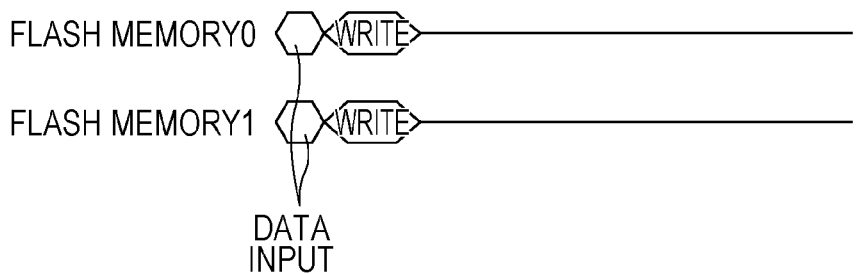

MEMORY DEVICE, MEMORY CONTROL DEVICE, AND MEMORY CONTROL METHOD

CROSS REFERENCES TO RELATED APPLICATIONS

The present application claims priority to Japanese Priority Patent Application JP 2012-102135 filed in the Japan Patent Office on Apr. 27, 2012, the entire content of which is hereby incorporated by reference.

BACKGROUND

The present disclosure relates to a memory device including a nonvolatile memory formed by memory cells capable of writing and reading multi-valued data, and to a memory device having an improved processing speed, a memory control device, and a memory control method.

In recent years, flash memories have been familiar as a kind of nonvolatile memory. In particular, a NAND-type flash memory is inexpensive and has a relatively high data write and read speed as a flash memory. Accordingly, the NAND-type flash memory is expected to replace an existing storage device such as an HDD (Hard Disk Drive), and so on.

In the NAND-type flash memory, one memory cell capable of storing data of a plurality of bits has been devised. This is called a multi-level cell (MLC). A related-art memory cell capable of storing one-bit data is called a single-level cell (SLC). In terms of operation speed and permissible number of times of writing, the SLC is superior. However, in terms of memory capacity, it is possible for the MLC to have a large capacity. Japanese Unexamined Patent Application Publication No. 2010-198407 has disclosed a configuration including an MLC area and an SLC area, and in which a life time as a storage device is increased by a combination of these areas, and at the same time, a recording density is increased. Also, Japanese Unexamined Patent Application Publication No. 2008-198265 has disclosed a configuration in which write speed is improved for a NAND-type flash memory including an MLC area.

SUMMARY

Incidentally, in a NAND-type flash memory including an MLC area, it is possible for one physical memory cell to store data of a plurality of bits independently. However, an occurrence of write error on certain bit data and an occurrence of power down during write operation sometimes affect bit data that has been already written. Accordingly, in the case of writing new bit data on a same memory cell, already written bit data is saved in another area so that it is possible to restore the bit data. However, overall write-processing speed falls because of this processing. It is desirable to provide a memory device having a still higher processing speed while ensuring reliability of write data.

According to an embodiment of the present disclosure, there is provided a memory device including: a plurality of nonvolatile memory sections configured to allow one memory cell to record data of a plurality of bits, and to include a corresponding number of pages to the plurality of bits in accordance with a plurality of the memory cells as a write control unit; and a control section configured to perform control of writing and reading data to and from the plurality of nonvolatile memory sections, wherein out of the plurality of nonvolatile memory sections, in a case where data is written into one of the nonvolatile memory sections, the data is written for each page in sequence from a low-order page to a high-order page, and when the data is written into the low-order page, control is performed such that the data to be written into the low-order page is written into any area of the other of the nonvolatile memory sections at same timing.

According to another embodiment of the present disclosure, there is provided a memory control device for performing control of reading and writing data on a plurality of nonvolatile memory sections configured to allow one memory cell to record data of a plurality of bits, and to include a corresponding number of pages to the plurality of bits in accordance with a plurality of the memory cells as a write control unit, the memory control device including: out of the plurality of nonvolatile memory sections, if data is written into one of the nonvolatile memory sections, writing the data for each page in sequence from a low-order page toward a high-order page, and when the data is written into a low-order page, writing data to be written into the low-order page into any area of the other of the nonvolatile memory sections at same timing.

According to still another embodiment of the present disclosure, there is provided a method of controlling a memory, in which data read and write control is performed on a plurality of nonvolatile memory sections configured to allow one memory cell to record data of a plurality of bits, and to include a corresponding number of pages to the plurality of bits in accordance with a plurality of the memory cells as a write control unit, the method including: out of the plurality of nonvolatile memory sections, if data is written into one of the nonvolatile memory sections, writing the data for each page in sequence from a low-order page toward a high-order page, and when the data is written into a low-order page, writing data to be written into the low-order page into any area of the other of the nonvolatile memory sections at same timing.

By such a technique according to the present disclosure, data that might be corrupted (disappear) is saved in another area, and thus it is possible to restore the data even if the original data is corrupted. Also, data is saved in another area at the same time with writing the data, and thus it is possible to increase the overall processing speed.

By the present disclosure, there is an advantage in that it is possible to achieve a memory device having a still higher processing speed while ensuring reliability of write data.

Additional features and advantages are described herein, and will be apparent from the following Detailed Description and the figures.

BRIEF DESCRIPTION OF THE FIGURES

FIG. 5A, FIG. 5B, and FIG. 5C are diagrams illustrating a page layout of a configuration of a NAND-type flash memory and write timing with improved speed according to the embodiment;

DETAILED DESCRIPTION

In the following, a description will be given of an embodiment in the order as follows.

1. Configuration of memory device
2. Internal configuration of nonvolatile memory according to the embodiment
3. Page write operation according to the embodiment
4. Page write timing and processing operation according to the embodiment

1. Configuration of Memory Device

Figure 1:
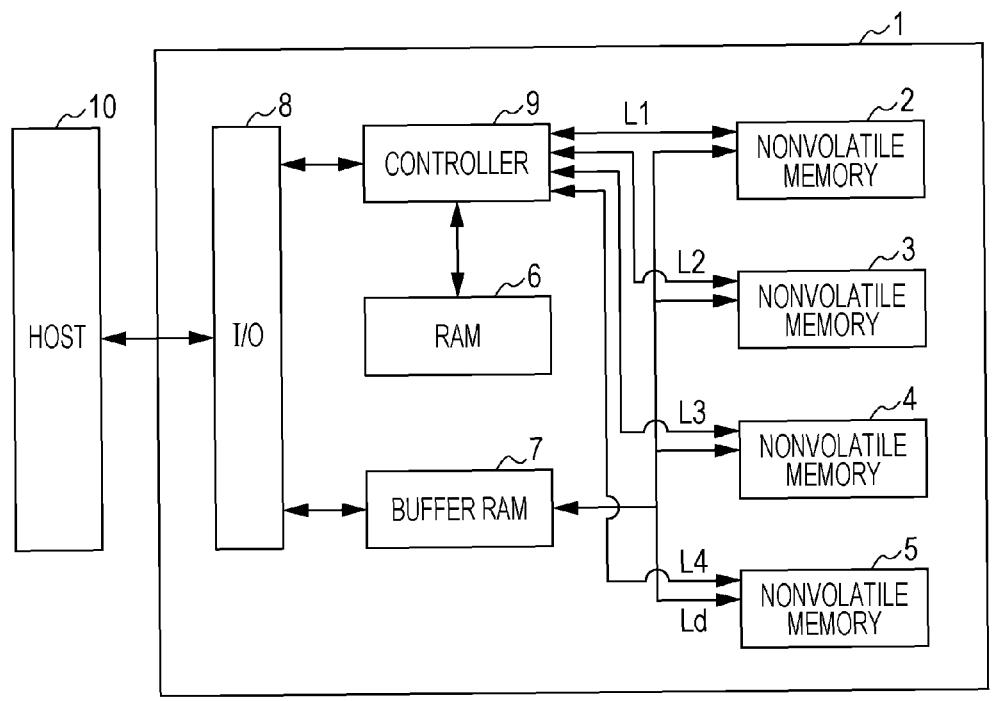
FIG. 1 is a diagram illustrating an internal configuration of a memory device according to an embodiment.

A description will be given of a configuration of a memory device according to the embodiment with reference to FIG. 1. FIG. 1 illustrates an internal configuration of a memory device according to the present embodiment.

As illustrated in FIG. 1, for example, the memory device includes a plurality of nonvolatile memories 2 to 5, a controller 9 for performing write and read control on these nonvolatile memories 2 to 5, a RAM (Random Access Memory) 6 to be used as a work area of the controller 9, a buffer RAM 7 in which read and write data of the nonvolatile memories 2 to 5 is temporarily stored, and an external interface 8.

The nonvolatile memories 2 to 5 are assumed to be NAND-type flash memories. In FIG. 1, an example including four nonvolatile memories is illustrated. Individual nonvolatile memories are denoted by a nonvolatile memory 2, a nonvolatile memory 3, a nonvolatile memory 4, and a nonvolatile memory 5.

Signal lines L1 to L4 are connected between the controller 9 and the individual nonvolatile memories 2 to 5, respectively, as illustrated in FIG. 1. The signal lines L1 to L4 are signal lines for supplying an enable signal to be used for instructing data read or write timing to the nonvolatile memories 2 to 5, which are to be read or written, respectively.

Also, a common data line Ld is connected to each of the nonvolatile memories 2 to 5. As illustrated in FIG. 1, the data line Ld is also connected to the buffer RAM 7. And thereby, it is possible to supply write data from the buffer RAM 7 to the nonvolatile memories 2 to 5, and to supply read data from the nonvolatile memories 2 to 5 to the buffer RAM 7.

In this regard, for wiring lines between the controller 9 and the nonvolatile memories 2 to 5, only the wiring lines related to a memory control method according to the present embodiment are particularly extracted and illustrated. In reality, for example, the other wiring lines such as a signal line for read or write addressing, and the like, are also connected.

The controller 9 performs overall control of the memory device.

Specifically, for example, the controller 9 performs interpretation of a command that the external interface 8 received from an external host 10, data write and read control on the nonvolatile memories 2 to 5 in accordance with the command, generation of various kinds of management information for managing recording data of the nonvolatile memories 2 to 5, and the like, further, ECC (Error Correction Code) data generation and addition at the time of writing data into the nonvolatile memories 2 to 5, and ECC error correction processing at the time of reading, and so on. In this regard, the controller 9 corresponds to a memory control device in claims.

The external interface 8 is disposed to make it possible to transmit and receive various kinds of data between the external host 10 and the controller 9, and receives a command from the host 10, and performs data transmission and reception, and the like.

Data that has been instructed to be written from the host 10 is temporarily stored into the buffer RAM 7 through the external interface 8, and then is written into any one of the predetermined nonvolatile memories 2 to 5 through a data line Ld under the control of the controller 9.

Also, when the host 10 gives a data read instruction to any one of the nonvolatile memories 2 to 5, read data from the corresponding nonvolatile memory is temporarily stored into the buffer RAM 7 through the data line Ld under the control of the controller 9, and then is transmitted to the host apparatus through the external interface 8.

2. Internal Configuration of Nonvolatile Memory According to the Embodiment

Figure 2:
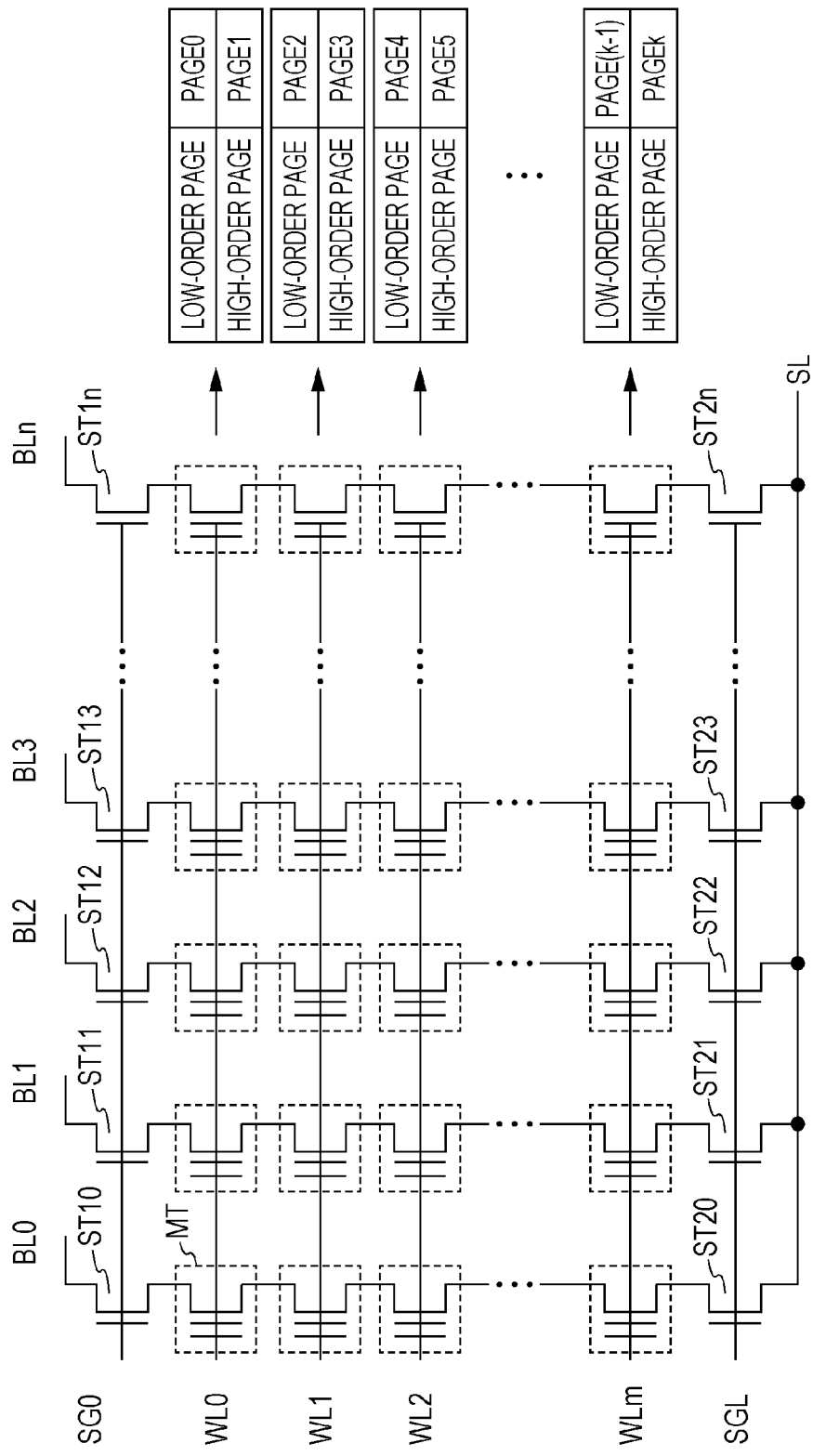
FIG. 2 is a diagram illustrating a relationship between a memory cell configuration and pages, according to the embodiment.

A description will be given of an internal configuration of a nonvolatile memory according to the embodiment of the present disclosure with reference to FIG. 2. In FIG. 2, a NAND-type flash memory is assumed to be a nonvolatile memory. As illustrated in FIG. 2, the NAND-type flash memory has a configuration of a memory cell array in which a plurality of electrically rewritable memory cells MT are disposed in a matrix.

The memory cells MT are connected in series, and both ends thereof are sandwiched by selection gate transistors ST. This configuration is called a NAND string. Here, each NAND string has a configuration in which m pieces of memory cells MT are connected in series. One end of each NAND string is connected to a corresponding one of bit lines BL0 to BLn through a corresponding one of selection gate transistors ST10 to ST1n that are connected to a drain-side selection gate line SG0, and the other end is connected to a common source line SL through a corresponding one of selection gate transistors ST20 to ST2n that are connected to a source-side gate line SGL. In a NAND string, a control gate of each memory cell MT in n-column bit lines is connected to a corresponding one of word lines WL0 to WLm.

A plurality of memory cells MT that are connected to a same one of the word lines WL0 to WLm are called a page. In the case of a single-level cell (SLC), this page is constituted by a plurality of memory cells MT.

In the memory cell MT according to the present disclosure, a multi-level cell (MLC) capable of storing multi-bit data is assumed, and thus the above-described page has the number on pages corresponding to the number of bits. FIG. 2 illustrates the memory cell MT capable of storing two-bit data, and the above-described plurality of memory cells MT constitute two pages. This correspondence is illustrated on the right side in FIG. 2.

As illustrated in FIG. 2, a low-order page and a high-order page are formed for each one of the word lines WL0 to WLm. Write and read operations are performed for each of the pages. Writing is performed in order from the low-order page to the high-order page, and it is difficult to write in order from the high-order page to the low-order page. If writing in the high-order page is failed, the contents of the low-order page may be corrupted (disappear) in principle.

3. Write Operation on Page According to the Embodiment

Figure 3:
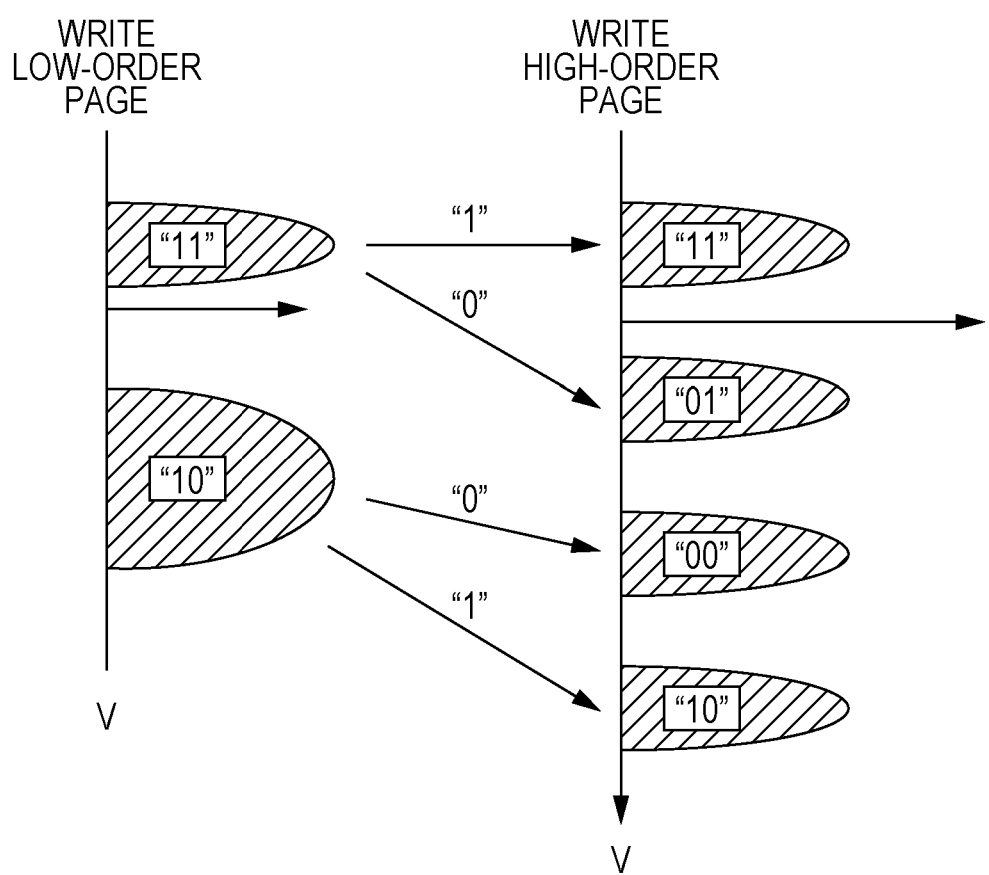
FIG. 3 is a diagram illustrating a threshold value distribution in the case of storing into a memory cell according to the embodiment.

A description will be given of write operation of a NAND-type flash memory according to the embodiment of the present disclosure with reference to FIG. 3 and FIGS. 4A and 4B. FIG. 3 schematically illustrates a threshold value distribution in a method of storing four-valued data (two bits), in which two bits are stored in one memory cell MT.

As illustrated in FIG. 3, it is possible to store two-page data for each memory cell MT. Writing is performed in order from a low-order page to a high-order page.

It is possible for a memory cell MT to hold any one of four-valued data "xy" that are defined by high-order page data "x" and low-order page data "y". Values are assigned to the four-valued data "xy" in order of threshold voltage value of the memory cell MT, for example, data "11", "01", "00", and "10" are assigned. The data "11" is a negative erasure state of the threshold voltage value of the memory cell MT. In this regard, a data assignment rule is not limited to this. Also, in the present embodiment, hereinafter, a description will be given of the case where one memory cell MT is capable of storing two-bit vales. However, a configuration in which one memory cell MT stores three bits or more may be employed.

In low-order page write operation, the data "10" is written selectively into a memory cell MT of the data "11" (erasure state) by writing the low-order bit data "y". In high-order page write operation, high-order bit data "x" is written selectively into a memory cell MT of the data "11" and a memory cell MT of the data "10" individually, and the data "01" and the data "00" are written. A threshold value distribution of data "10" before writing the high-order page is positioned in the middle of the data "01" after writing the high-order page and the threshold value distribution of the data "00", and in general, is wider than the threshold value distribution after writing the high-order page.

The threshold value distribution of the data "10" before writing the high-order page is positioned in the middle of the data "01" after writing the high-order page and the threshold value distribution of the data "00". Accordingly, if an error occurs at the time of writing high-order bit data into a memory cell MT in which the low-order bit data "y"="0" is written, it becomes difficult to determine whether the low-order bit data was "1" or "0". That is to say, if an error occurs during writing the high-order page, data in the low-order page might be corrupted.

Thus, it becomes necessary to take a backup of data that might be corrupted against data corruption at the time of the occurrence of a write error.

Figure 4A:
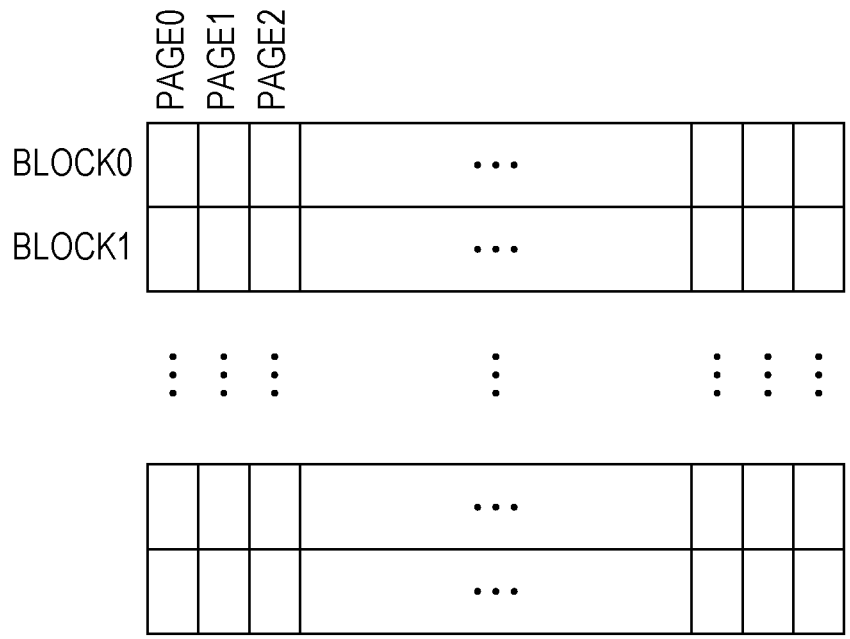
FIG. 4A and FIG. 4B are diagrams illustrating a configuration of a NAND-type flash memory and write operation according to the embodiment, respectively.
Figure 4B:
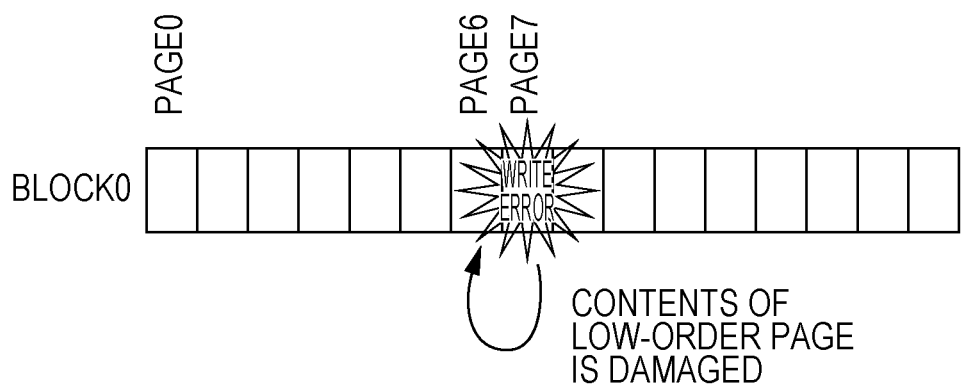

FIGS. 4A and 4B illustrate a relationship between pages and blocks in a NAND-type flash memory, and a simple schematic diagram of write operation, respectively.

As illustrated in FIG. 4A, a plurality of pages constitute one block. Here, each page corresponds to the page illustrated in FIG. 2, and the memory array illustrated in FIG. 2 corresponds to one block.

FIG. 4B simply illustrates data corruption in write operation. As illustrated in FIG. 4B, if a write error occurs when write operation is performed on page7, thereby the contents of page6 is corrupted. Here, page7 is a high-order page, and page6 is a low-order page.

4. Page Write Timing and Processing Operation According to the Embodiment

A description will be given of page write timing on a NAND-type flash memory according to the embodiment with reference to FIGS. 5A to FIGS. 6B.

Figure 6A:
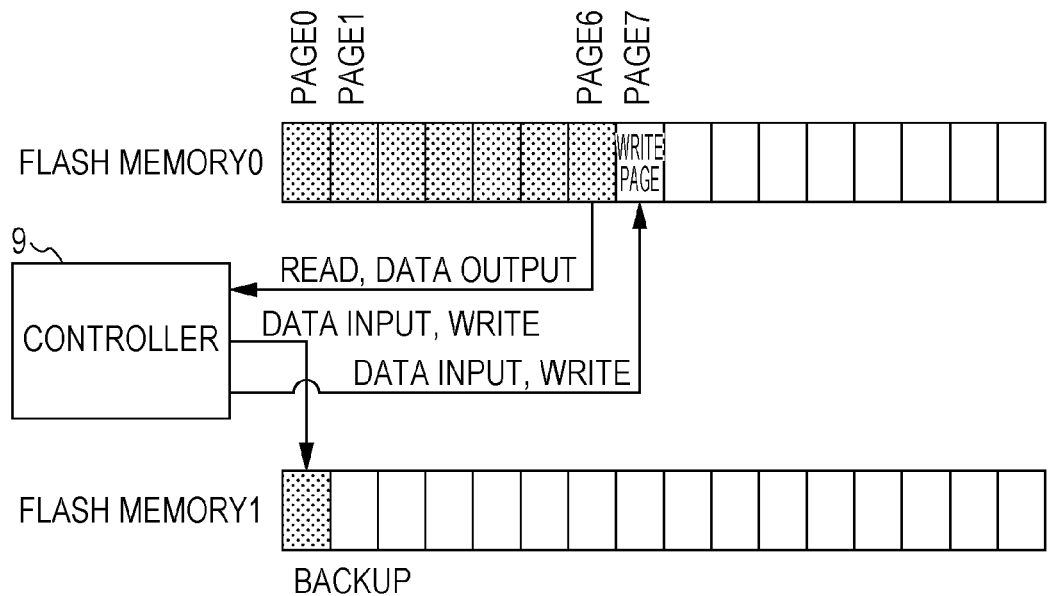
FIG. 6A and FIG. 6B are diagrams illustrating a page layout of a configuration of a NAND-type flash memory and general write timing.
Figure 6B:
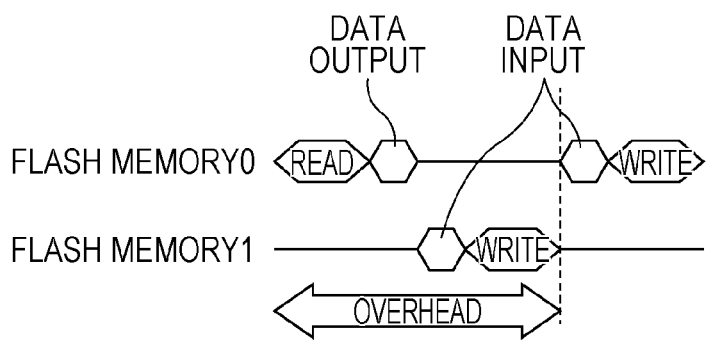

FIGS. 5A, 5B, and 5C illustrate page relationships between high-order pages and low-order pages, backup operation, and write timing, respectively. FIGS. 6A and 6B are operation as a comparative example with FIGS. 5A, 5B, and 5C and illustrate general backup operation and write timing, respectively.

As illustrated in FIG. 5A, low-order pages correspond to even-numbered pages, and high-order pages correspond to odd-numbered pages. As already explained, in a NAND-type flash memory according to the embodiment, one physical memory cell MT is capable of storing plural-bit data (multi-valued data). Here, a two-bit data NAND-type flash memory is assumed, and thus it is possible to store two-page data for a low-order page and a high-order page in a page corresponding to one-bit data.

In the case of three-bit or more data instead of two-bot data, there are a plurality of pages in sequence from a low-order page to a high-order page.

However, because of the characteristic in which a page corresponding to the above-described one-bit data is capable of storing two-page data, that is to say, a low-order page and a high-order page, an occurrence of write error and an occurrence of power down during write operation sometimes affect another page (low-order page) as illustrated in FIG. 4B. To put it another way, the contents of the low-order page is sometimes corrupted (disappear).

In general, as illustrated in FIG. 6A, when a certain page (a low-order page) is already written, and next, if data is newly written in a high-order page (the same memory cell), the already written data is copied (backed up) to another area immediately before the writing so that data corruption (disappearance) is prevented.

By this operation, it is possible to perform restoration processing using the copied data even if writing new data fails and the data is corrupted.

However, the above-described backup is taken, for example, by copying the contents of the page6 (low-order page) to a specific area of the other flash memory 1 (NAND type) without fail immediately before new data is written into the page7 (high-order page) of the flash memory 0 (NAND type) as illustrated in FIG. 6A. This operation timing is illustrated in FIG. 6B.

As illustrated in FIG. 6B, a series of processing is performed in sequence of timing from reading the contents of page6 from the flash memory 0 (NAND type), outputting the data, and then inputting the data into the flash memory 1 (NAND type), and writing the data. Thus, writing into page7 is not started until the time when the copy processing into the flash memory 1 (NAND type) is fully completed. Accordingly, as illustrated in FIG. 6B, a so-called overhead, which takes time outside of the original target processing, occurs. Accordingly, write processing speed drops as the entire memory device. Here, a description has been given by taking the page6 and the page7 as an example. However, the same operation is performed for a relationship between a low-order page and a high-order page.

In contrast, in the operation timing illustrated in FIG. 5C, which is the embodiment of the present disclosure, the above-described overhead will not occur.

As illustrated in FIG. 5B, when new data is written into page6, which is a low-order page, and then into page7 (in a same memory cell), which is a high-order page, in sequence, data to be written into page6 is copied (backed up) to another area in the flash memory 1 (NAND type). Saving (backing up) in another area itself is the same as described above.

As illustrated in FIG. 5C, this backup operation is carried out in such a way that when data is written in the page6 (low-order page) of the target flash memory 0 (NAND type), the data to be written into the page6 (low-order page) is written into an area of a separate flash memory 1 (NAND type) at the same timing. After this writing is complete, data is written into page7 (high-order page). Unlike the above-described method, an overhead does not occur, and thus it becomes possible to increase the overall operation speed, and to improve performance using this method.

Also, the above described separate NAND-type flash memory 1 ought to be at least another memory, and is not limited to a NAND-type flash memory. Further, when writing into the page6 (low-order page), it is necessary for the controller 9 to access at least two nonvolatile memories at the same time.

Here, a description has been given by taking the page6 (low-order page) as an example, but the same operation is performed in the case of the other low-order pages.

Also, in the case of a NAND-type flash memory capable of recording three-or-more bit data in one memory cell, there are a plurality of high-order pages for a low-order page. As long as there is a high-order page, the above-described operation is performed in writing data in a low-order page just before the high-order page. Accordingly, it is possible to shorten the above-described overhead for the existence of high-order pages. And the larger the number of high-order pages (the larger the number of bits of bit data that is allowed to be recorded in one memory cell), the greater the advantage of speeding up is obtained.

Next, a description will be given of processing operation of backup operation by the controller 9 according to the embodiment using a flowchart in FIG. 7.

Figure 7:
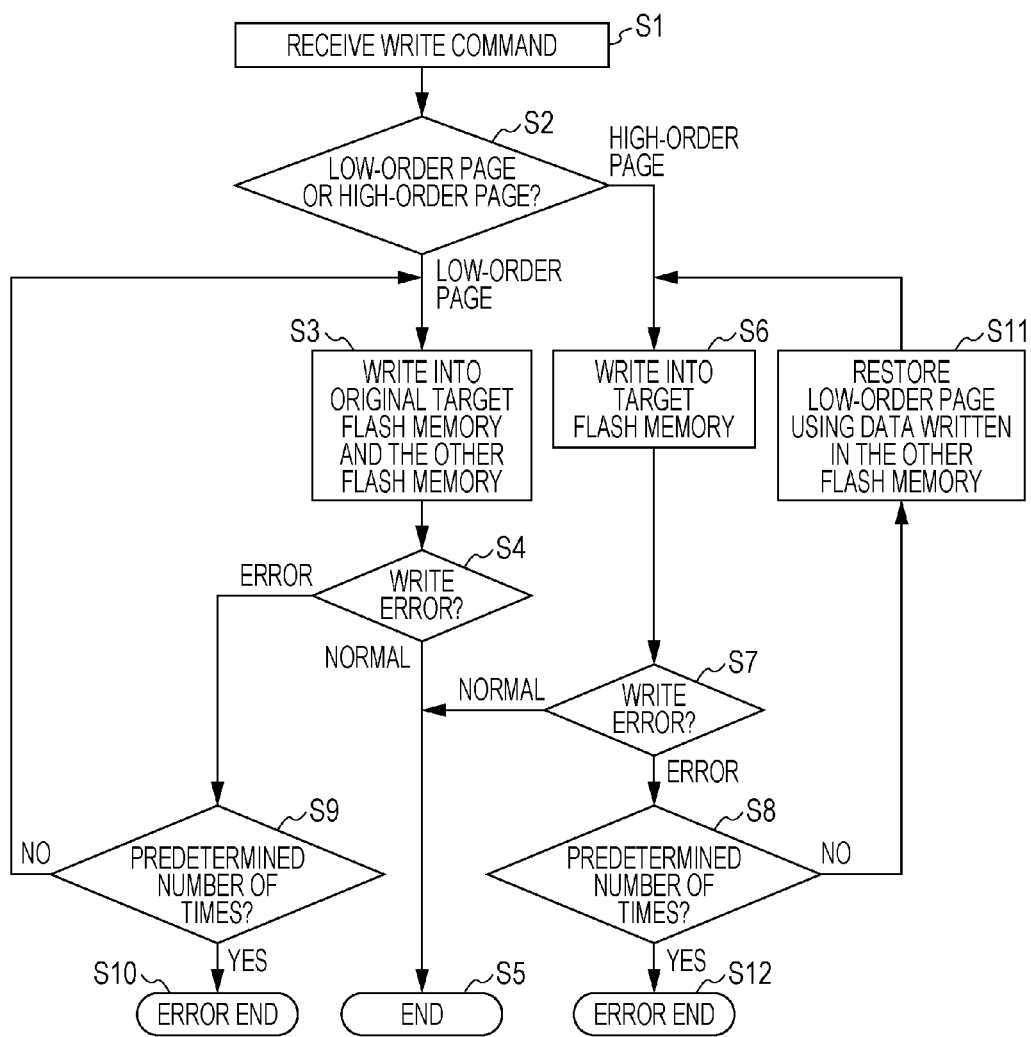
FIG. 7 is a flowchart of backup operation according to the embodiment.

As illustrated in FIG. 7, first in step S1, a write command from the host 8 is received.

In step S2, a determination is made of whether writing into a low-order page or a high-order page.

In step S2, in the case of writing into a low-order page, the processing proceeds to step S3. In step S3, data to be written is written into an original target flash memory and a flash memory other than this flash memory at the same time. Next, the processing proceeds to step S4. In step S4, a determination is made of whether writing has been normally ended. In the case of normally end, the processing proceeds to step S5, and the write operation into the low-order page normally ends.

In step S4, in the case of a write error, the processing proceeds to step S9, and the number of rewriting into the low-order page is determined. If the number of rewriting has not reached a predetermined number of times, the processing proceeds to step S3 and writing is performed again. And the processing proceeds to step S7, if the writing is normal, the processing proceeds to step S5, and ends normally. If a write error occurs, the processing proceeds to step S9, and rewriting is repeated for a predetermined number of times.

Also, in step S9, if the number of rewriting has reached the predetermined number of times, the processing proceeds to step S10, and ends abnormally.

In step S2, in the case of writing into a high-order page, the processing proceeds to step S6. In step S6, data to be written is written into the target flash memory. Next, the processing proceeds to step S7. In step S7, a determination is made of whether writing has been normally ended. In the case of normal end, the processing proceeds to step S5, and the write operation into the high-order page ends normally.

In step S7, in the case of a write error, the processing proceeds to step S8, and the number of rewriting into the high-order page is determined. If the number of rewriting has not reached a predetermined number of times, the processing proceeds to step S11 for rewriting. Here, in step S3, the low-order page is restored using the data written into the other flash memory. Further, the processing proceeds to step S6, and data to be written into the high-order page is rewritten into the target flash memory. In step S8, if the number of rewriting times has reached the predetermined number of times, the processing proceeds to step S12, and the processing ends with an error.

By performing the processing in FIG. 7, even if an error occurs at the time of writing into the high-order page, thus fails in writing, and the contents of the low-order page is corrupted (disappears), it becomes possible to suitably restore the low-order page. Further, at the time of writing into the low-order page, data to be written is written into the original target flash memory and the other memory at the same time, and an overhead does not occur, and thus it is possible to improve the overall operation speed.

In this regard, it is possible for the present technique to employ the following configuration.

(1) A memory device including:
a plurality of nonvolatile memory sections configured to allow one memory cell to record data of a plurality of bits, and to include a corresponding number of pages to the plurality of bits in accordance with a plurality of the memory cells as a write control unit; and
a control section configured to perform control of writing and reading data to and from the plurality of nonvolatile memory sections,
wherein out of the plurality of nonvolatile memory sections, in a case where data is written into one of the nonvolatile memory sections, the data is written for each page in sequence from a low-order page to a high-order page, and when the data is written into the low-order page, control is performed such that the data to be written into the low-order page is written into any area of the other of the nonvolatile memory sections at same timing.

(2) The memory device according to (1),
wherein when the control section writes data into the low-order page, the control section is allowed to access at least two nonvolatile memory sections simultaneously among the plurality of nonvolatile memory sections.

(3) The memory device according to (1) or (2),
wherein the data of the plurality of bits is two bits.

(4) The memory device according to any one of (1) to (3),
wherein the nonvolatile memory sections are NAND-type flash memories.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A memory device comprising:
a plurality of nonvolatile memory sections each comprising a plurality of memory cells connected to word lines; and
a control section configured to perform control of writing and reading data to and from the plurality of nonvolatile memory sections,
wherein each of the plurality of memory cells is configured to record data of a plural number of bits,
wherein each word line includes a group of pages having a number of pages equal to the plural number of bits, each page comprising memory cells connected to a same word line, and
wherein for the plurality of nonvolatile memory sections, in a case where data is written into one of the nonvolatile memory sections, the data is written for each group of pages in sequence from a low-order page to a high-order page, and when the data is written into the low-order page, control is performed such that the data to be written into the low-order page is written into any area of the other of the nonvolatile memory sections at a same time.

2. The memory device according to claim 1,
wherein when the control section writes data into the low-order page, the control section is allowed to access at least two nonvolatile memory sections simultaneously among the plurality of nonvolatile memory sections.

3. The memory device according to claim 1,
wherein the plural number of bits is two.

4. The memory device according to claim 1,
wherein the nonvolatile memory sections are NAND-type flash memories.

5. A memory control device for performing control of reading and writing data on a plurality of nonvolatile memory sections each comprising a plurality of memory cells connected to word lines, wherein each of the plurality of memory cells is configured to record data of a plural number of bits, and wherein each word line includes a group of pages having a number of pages equal to the plural number of bits, each page comprising memory cells connected to a same word line, the memory control device performing processing comprising:

for the plurality of nonvolatile memory sections, in a case where data is written into one of the nonvolatile memory sections, writing the data for each group of pages in sequence from a low-order page to a high-order page, and when the data is written into the low-order page, performing control such that the data to be written into the low-order page is written into any area of the other of the nonvolatile memory sections at a same time.

6. The memory control device according to claim 5,
wherein the nonvolatile memory sections are NAND-type flash memories.

7. A method of controlling a memory, in which data read and write control is performed on a plurality of nonvolatile memory sections each comprising a plurality of memory cells connected to word lines, wherein each of the plurality of memory cells is configured to record data of a plural number of bits, and wherein each word line includes a group of pages having a number of pages equal to the plural number of bits, each page comprising memory cells connected to a same word line, the method comprising:

for the plurality of nonvolatile memory sections, in a case where data is written into one of the nonvolatile memory sections, writing the data for each group of pages in sequence from a low-order page to a high-order page, and when the data is written into the low-order page, performing control such that the data to be written into the low-order page is written into any area of the other of the nonvolatile memory sections at a same time.

* * * * *